United States Patent
Yoshida et al.

(10) Patent No.: US 7,463,297 B2
(45) Date of Patent: Dec. 9, 2008

(54) LIQUID CRYSTAL DISPLAY DEVICE PROVIDED WITH AN IMAGE CAPTURING FUNCTION

(75) Inventors: Masahiro Yoshida, Fukaya (JP); Takashi Nakamura, Saitama (JP); Hirotaka Hayashi, Fukaya (JP); Norio Tada, Kumagaya (JP); Jun Hirota, Fukaya (JP); Masaki Kinoshita, Saku (JP)

(73) Assignee: Toshiba Matsushita Display Technology Co., Ltd., Tokyo (JP)

( * ) Notice: Subject to any disclaimer, the term of this patent is extended or adjusted under 35 U.S.C. 154(b) by 739 days.

(21) Appl. No.: 10/998,836

(22) Filed: Nov. 30, 2004

(65) Prior Publication Data

US 2005/0128331 A1 Jun. 16, 2005

(30) Foreign Application Priority Data

Dec. 12, 2003 (JP) ............................ P2003-414615

(51) Int. Cl.
*H04N 5/335* (2006.01)
(52) U.S. Cl. ..................................................... 348/294
(58) Field of Classification Search ................ 348/310, 348/308, 302, 311, 294; 345/102, 98, 100, 345/103, 90, 92
See application file for complete search history.

(56) References Cited

U.S. PATENT DOCUMENTS

| | | | | |
|---|---|---|---|---|
| 5,111,194 A | * | 5/1992 | Oneda | 345/690 |
| 5,340,978 A | * | 8/1994 | Rostoker et al. | 250/208.1 |
| 5,453,845 A | * | 9/1995 | Nonoshita et al. | 358/442 |
| 5,461,425 A | * | 10/1995 | Fowler et al. | 348/294 |
| 5,610,726 A | * | 3/1997 | Nonoshita et al. | 358/442 |
| 5,966,112 A | * | 10/1999 | Katagiri et al. | 345/104 |
| 6,236,063 B1 | | 5/2001 | Yamazaki et al. | |
| 6,243,069 B1 | * | 6/2001 | Ogawa et al. | 345/102 |
| 2004/0189566 A1 | * | 9/2004 | Nakamura et al. | 345/87 |

FOREIGN PATENT DOCUMENTS

| | | |
|---|---|---|
| CN | 1224511 A | 7/1999 |
| EP | 0 915 367 A1 | 5/1999 |
| JP | 8-272529 | 10/1996 |

* cited by examiner

*Primary Examiner*—David Ometz
*Assistant Examiner*—Nicholas G Giles
(74) *Attorney, Agent, or Firm*—Oblon, Spivak, McClelland, Maier & Neustadt, P.C.

(57) ABSTRACT

To enable acquisition of image data in multiple tone levels in a short capturing time, a liquid crystal display device 1 includes a photodiode having sensitivity R, a capacitor having capacitance C and configured to store a charge in response to an electric signal converted by the photodiode in a state where an initial voltage V is applied thereto, a SRAM configured to retain binary data which indicate as to whether or not an amount of charge stored in the capacitor is equal to or above a threshold voltage Vth, an image capturing control unit 5 configured to generate pixel data in multiple tone levels based on the binary data outputted from the SRAM of a plurality of adjacent pixels. Here, at least any one value of R, V, C, and Vth in each of the pixels is set to a different value from relevant values of other adjacent pixels.

4 Claims, 7 Drawing Sheets

LIQUID CRYSTAL DISPLAY DEVICE PROVIDED WITH AN IMAGE CAPTURING FUNCTION

CROSS-REFERENCE TO RELATED APPLICATIONS

This application is based upon and claims the benefit of priority from Japanese Patent Application No. 2003-414615 filed on Dec. 12, 2003; the entire contents of which are incorporated herein by reference.

BACKGROUND OF THE INVENTION

1. Field of the Invention

The present invention relates to a liquid crystal display device provided with an image capturing function.

2. Description of the Related Art

A liquid crystal display device is constituted by a glass array substrate including a pixel array unit in which pixels are arranged at respective intersections of a plurality of signal lines and a plurality of scan lines, a glass counter substrate disposed opposite to this array substrate, and a liquid crystal layer retained in a space between the array substrate and the counter substrate.

In recent years, the manufacturing technique for forming thin film transistors (TFTs) made of a polysilicon material on the array substrate has been established, and the process technique for forming driving circuits to drive the signal lines and the scan lines onto the single array substrate together with the pixel array unit has been put to practical use. In this way, the entire liquid crystal display devices become lighter and smaller, and are used in various devices such as cellular telephones or notebook computers.

Incidentally, there is proposed a liquid crystal display device in which a pixel array unit includes a coherent optical sensor for capturing an image (such as Japanese Unexamined Patent Publication No. H8(1996)-272529). In the liquid crystal display device of this type, a capacitor is connected to an optical sensor configured to flow a current corresponding to irradiation intensity, a amount of charge in this capacitor is changed in response to an amount of light received by the optical sensor, image data are acquired by detecting voltages at both terminals of the capacitor, and the image data are captured into a static random access memory (SRAM).

However, the SRAM can only distinguish binary values of "0" and "1". Accordingly, in order to acquire the image data in multiple tone levels, it is necessary to capture the image for multiple times while varying conditions. As a result, the time required for image capturing is increased, and it is difficult to capture a subject stably.

SUMMARY OF THE INVENTION

An object of the present invention is to provide a liquid crystal display device, which is capable of acquiring image data in multiple tone levels in a short time period for image capturing.

A liquid crystal display device of the present invention includes: a plurality of pixels; optical sensors established corresponding to each of the pixels, each optical sensor having sensitivity R and configured to convert accepted light into an electric signal; charge storage units established corresponding to each of the optical sensors, each charge storage unit having capacitance C and configured to store a charge in response to the electric signal converted by the optical sensor in a state where an initial voltage V is applied thereto; retention units established corresponding to each of the charge storage unit, each retention unit configured to retain binary data which indicate as to whether or not an amount of charge stored in the charge storage unit is equal to or above a threshold voltage Vth; and an image capturing control unit configured to generate pixel data in multiple tone levels, based on the binary data outputted from each of the retention units of the plurality of adjacent pixels by image capturing for N times, wherein at least any one value of sensitivity R, capacitance C, an initial voltage V, and the threshold voltage Vth in each of the pixels is set to a different value from relevant values of other adjacent pixels.

According to the invention, it is possible to increase tone level information of the image data acquired in one image capturing by generating the pixel data in multiple tone based on the binary data acquired from the plurality of adjacent pixels having mutually different values of the respective parameters.

DESCRIPTION OF THE EMBODIMENT

Figure 1:
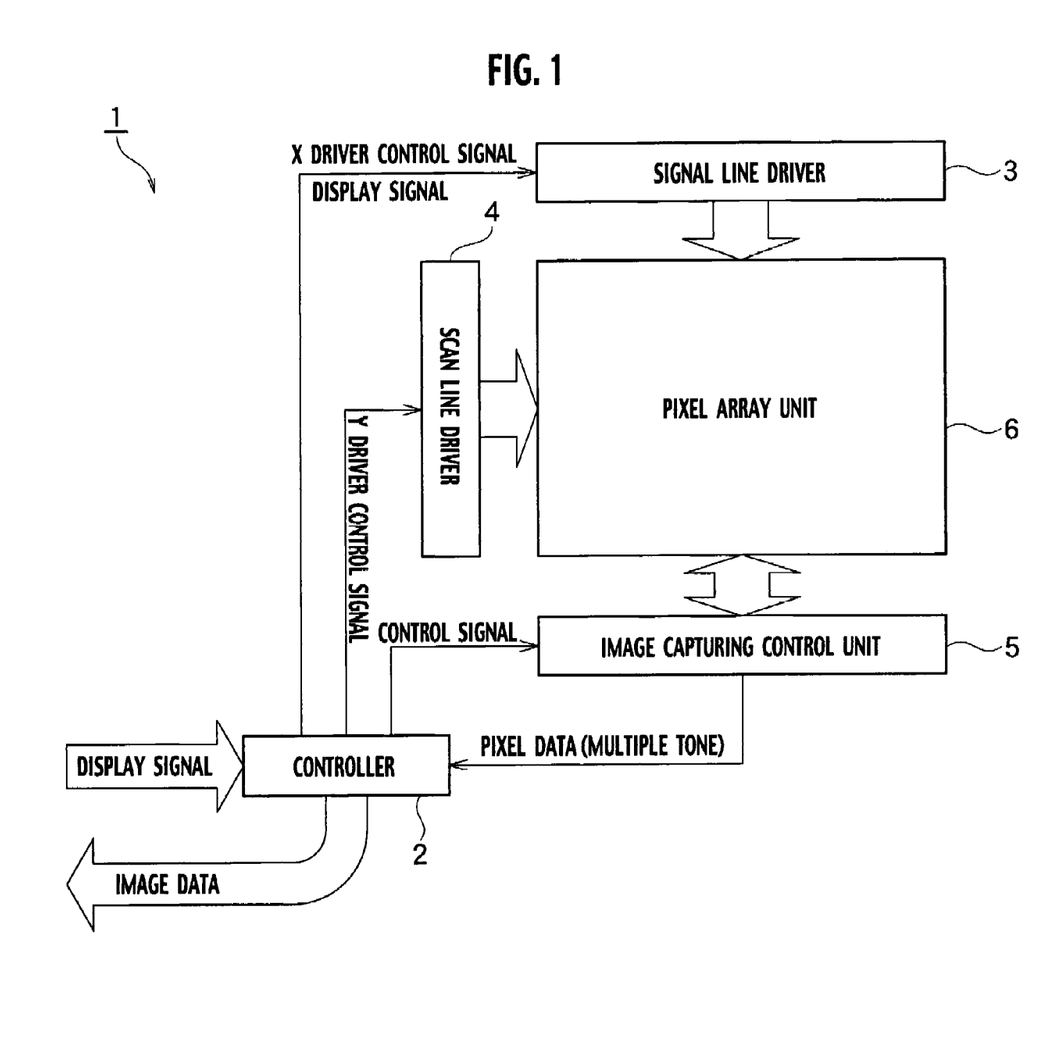
FIG. 1 is a block diagram showing a configuration of a liquid crystal display device according to one embodiment of the present invention.

As shown in a block diagram of FIG. 1, a liquid crystal display device 1 of this embodiment includes a controller 2, a signal line driver (an X driver) 3, a scan line driver (a Y driver) 4, an image capturing control unit 5, and a pixel array unit 6.

In the pixel array unit 6, a plurality of signal lines and a plurality of scan lines are arranged to intersect one another, and pixels are provided at the respective intersections.

The controller 2 has a function to supply a display signal, an X driver control signal, and a clock signal to the signal line driver 3, a function to supply a Y driver control signal and the clock signal to the scan line driver 4, and a function to supply a control signal for instructing the image capturing control unit 5 to capture an image and thereby to generate image data of a subject by use of pixel data in multiple tone levels which are outputted from the image capturing control unit 5.

The signal line driver 3 includes output lines each of which is connected to each of the signal lines in the pixel array unit 6. Moreover, the signal line driver 3 has a function to supply a display signal to each of the signal lines, based on the clock signal and the X driver control signal which are supplied from the controller 2.

The scan line driver 4 includes output lines each of which is connected to each of the scan lines in the pixel array unit 6. Moreover, the scan line driver 4 has a function to supply a scan signal for driving each of the scan lines to each of the scan lines, based on the clock signal and the Y driver control signal which are supplied from the controller 2.

The image capturing control unit 5 has a function to output a signal for starting image capturing of a subject disposed in front of a screen, to each of the pixels, based on the control signal supplied from the controller 2, and a function to generate and output pixel data in multiple tone levels as a piece of data outputted from one pixel, based on binary data outputted from each SRAM (static random access memory) 13 in each of the mutually adjacent pixels in a predetermined number (longitudinal p pieces×lateral q pieces).

Figure 2:
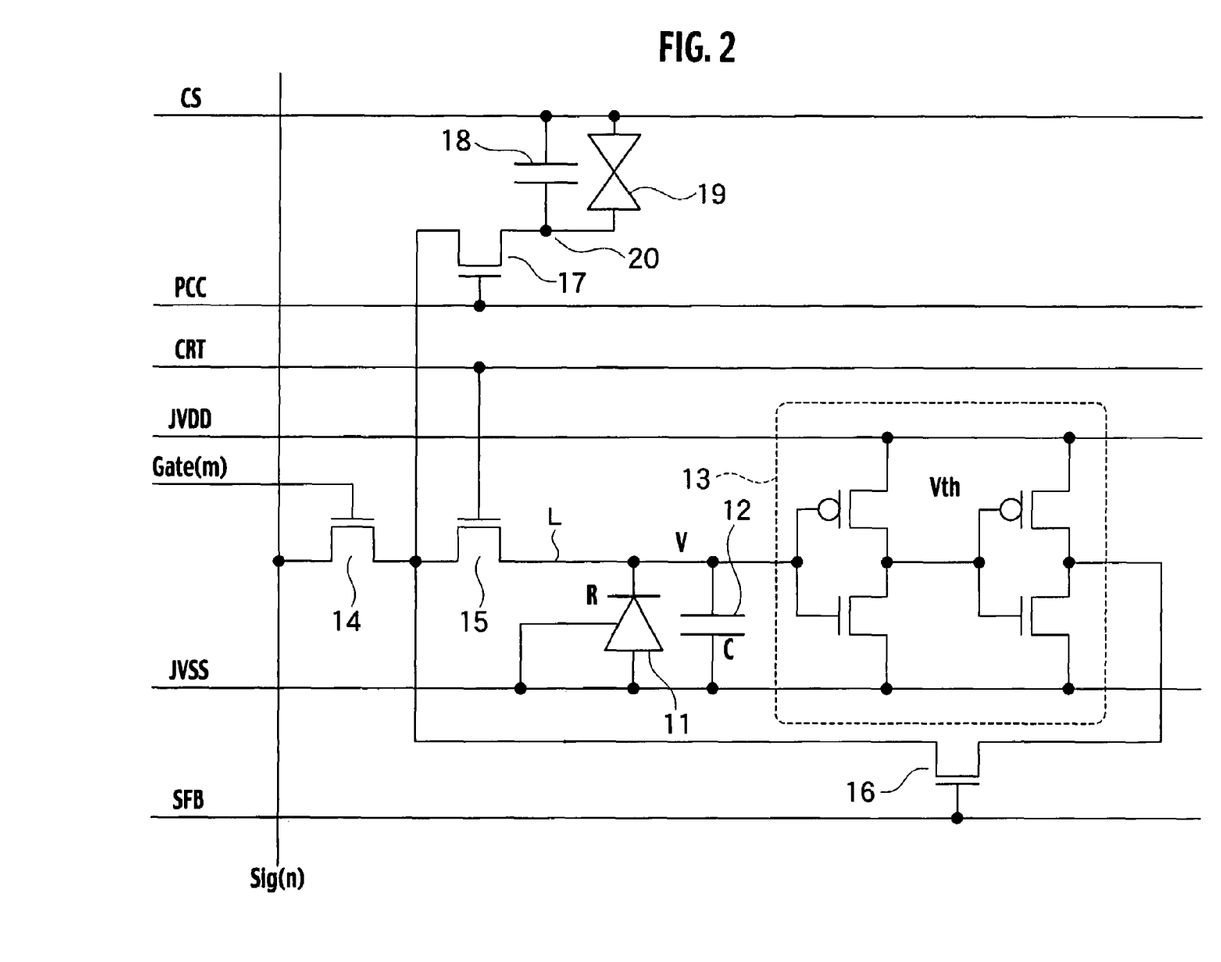
FIG. 2 is a circuit diagram showing a configuration of one pixel in a pixel array unit.

As shown in FIG. 2, one pixel in the pixel array unit 6 includes: a photodiode 11; a capacitor 12; an SRAM 13 for retaining binary data in response to an amount of charge stored in the capacitor 12; and an initialization TFT 15 for controlling an initial charge in the capacitor 12, collectively as an image capturing circuit. The pixel in the pixel array unit 6 also includes: a storage capacitor 18 for storing the charge corresponding to a display signal; a liquid crystal capacitor 19 connected to the storage capacitor 18 through a pixel electrode 20; a pixel TFT 14 for controlling output or non-output of the display signal supplied to a signal line Sig(n) to the pixel electrode 20; and a display control TFT 17 for controlling whether or not the charge is stored in the storage capacitor 18, collectively as a display circuit.

The photodiode 11 is an example of an optical sensor, which has sensitivity R and converts the accepted light into an electric signal.

The capacitor 12 has capacitance C and stores the charge in response to the electric signal converted by the photodiode 11 in a state where an initial voltage V is applied thereto.

The SRAM 13 retains the binary data which indicate as to whether or not the amount of charge stored in the capacitor 12 is equal to or above a threshold voltage Vth for the SRAM 13.

This SRAM 13 is formed by connecting two inverter circuits in series. A data retention TFT 16 for controlling retention of the binary data in the SRAM 13 is connected between an output terminal of the latter inverter circuit, and, a node of a source electrode of the pixel TFT 14 and a drain electrode of the initialization TFT 15. The two inverter circuits are respectively connected to a power source line JVDD and a power source line JVSS. An input terminal of the former inverter circuit is connected to a control line L extending from a source electrode of the TFT 15.

A cathode terminal of the photodiode 11 is connected to the control line L, and an anode terminal of the photodiode 11 is connected to the power source line JVSS. The capacitor 12 is connected between the power source line JVSS and the control line L, and a drain electrode of the pixel TFT 14 is connected to the signal line Sig(n).

A gate electrode of the data retention TFT 16 is connected to a control line SFB (SRAM Feed Back), and a gate electrode of the initialization TFT 15 is connected to a control line CRT (Capacitor Reset Transistor).

A gate electrode of the pixel TFT 14 is connected to a scan line Gate(m), and the source electrode of the pixel TFT 14 is connected to the drain electrode of the initialization TFT 15 and to a drain electrode of the display control TFT 17. A gate electrode of the display control TFT 17 is connected to a control line PCC (Pixel Cs Connection), and the storage capacitor 18 and the liquid crystal capacitor 19 are connected between a source electrode of the display control TFT 17 and a storage capacitor line CS.

An image capturing operation in the pixel having the above-described configuration will be carried out as follows.

Firstly, a predetermined amount of charge is stored in the capacitor 12 in advance. Then, a photo-leakage current is generated in response to irradiation intensity of the light when the light is irradiated on the photodiode 11, whereby the amount of charge stored in the capacitor 12 is reduced. A piece of the binary data indicating any of "0" or "1" is generated depending on whether or not the reduced amount of stored charge is equal to or above a threshold value for the inverter circuit, and the piece of binary data is retained in the SRAM 13.

Whether the piece of binary pixel data represents "1" or "0" depends on the irradiation intensity of the light, the sensitivity R of the photodiode 11, the initial voltage V of the capacitor 12, the capacitance C of the capacitor 12, and the threshold voltage Vth of the inverter constituting the SRAM 13.

However, in a conventional liquid crystal display device, the respective parameters of the sensitivity R, the initial voltage V, the capacitance C, and the threshold voltage Vth have been set equal in each pixel. Accordingly, whether the piece of binary pixel data represents "1" or "0" solely depends on the irradiation intensity of the light. Therefore, it has been possible to acquire only one tone level as tone information.

On the contrary, in the liquid crystal display device of this embodiment, at least any one value of the parameters of the sensitivity R, the initial voltage V, a coefficient of capacitance C, and the threshold voltage Vth is set to different values among a plurality of mutually adjacent pixels. Moreover, the binary data acquired by the SRAM 13 for each pixel are treated as the pixel data for one pixel. In this way, it is possible to increase tone information of image data acquired in one image capturing.

Figure 3:
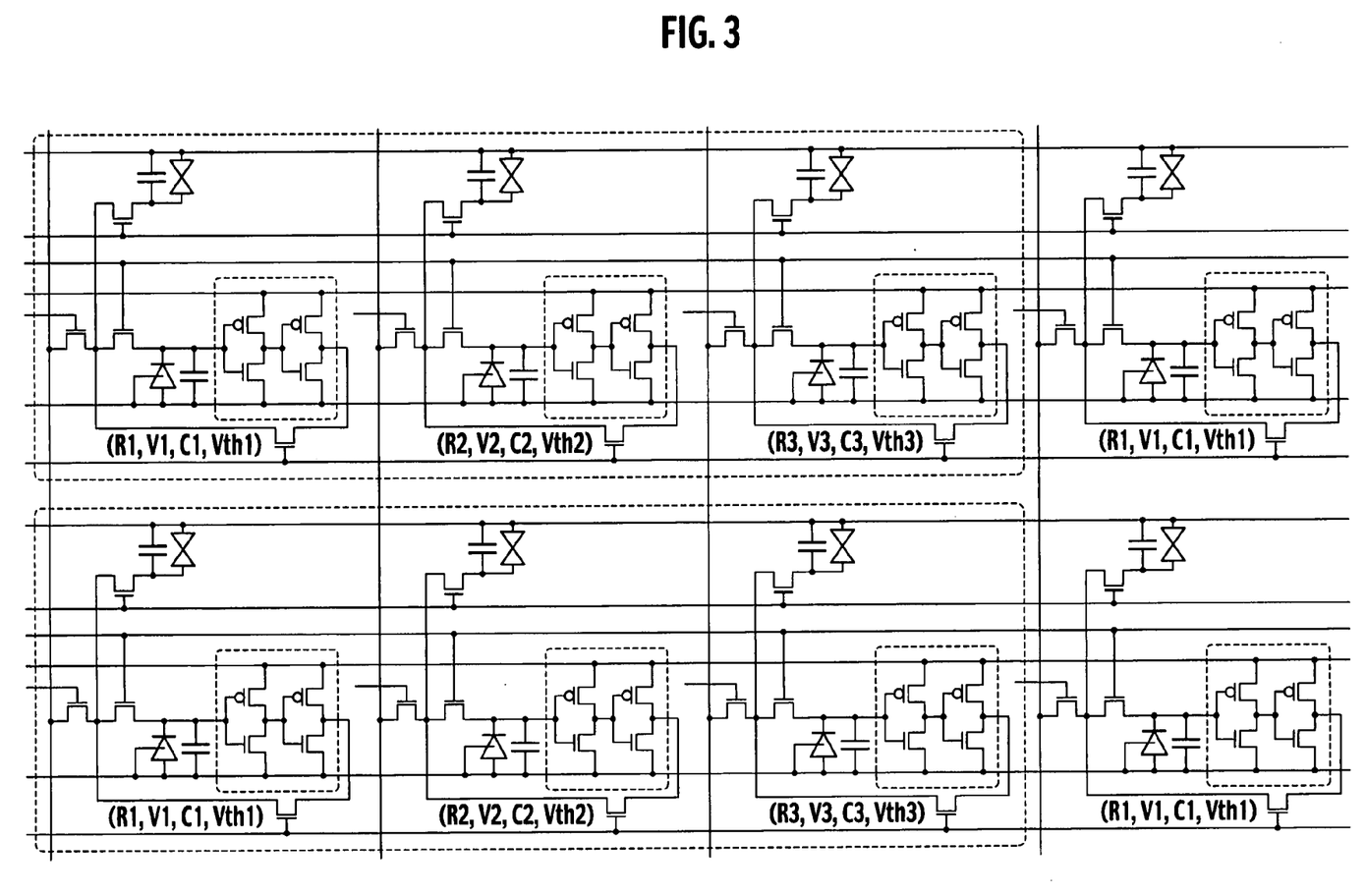
FIG. 3 is a circuit diagram showing a configuration of the pixel array unit when changing respective parameters depending on the pixels.

For example, as shown in FIG. 3, three pixels aligned in a lateral direction are formed into one set, and the respective parameters in the respective pixels are varied as $(R_1, V_1, C_1, Vth_1)$, $(R_2, V_2, C_2, Vth_2)$, and $(R_3, V_3, C_3, Vth_3)$. In this way, it is possible to acquire information corresponding to three tone levels in one image capturing.

This point will be further described in detail.

Assuming that the irradiation intensity of the light incident on the photodiode 11 is L, that reversal exposure time (to be described later in detail) is T, that an optical current flowing on the photodiode 11 is I, and that a dark current is $I_0$, the following equations hold true:

$$V - Vth = \frac{(I + I_0)T}{C} \quad (1)$$

$$I = RL \quad (2)$$

Here, V is the initial voltage of the capacitor 12, Vth is a threshold value for the inverter of the SRAM 13, C is the coefficient of capacitance of the capacitor 12, and R is optical sensitivity (an optical current per unit irradiation intensity) of the photodiode 11.

A time period from a point when the TFT 14 is set to an off-state to a point when the TFT 14 and the TFT 15 are set to an on-state will be referred to as "exposure time". In this exposure time, the voltage on the capacitor 12 gradually declines from the initial voltage V due to the current (a sum of the optical current and the dark current) flowing on the photodiode 11. Meanwhile, a time period elapsed until the voltage on the capacitor 12 becomes equal to the threshold voltage Vth for the inverter of the SRAM 13 will be referred to as the "reversal exposure time".

Here, by solving the foregoing two equations for L, the following equation is derived:

$$L = \frac{C(V - Vth)}{RT} - \frac{I_0}{R} \quad (3)$$

Since the respective values of C, V, Vth, R, and $I_0$ are known, the exposure time T is only necessary for detecting the value of the irradiation intensity L. Although T is originally an analog value, it is possible to acquire the L value in multiple tone levels by quantizing and converting the T into digital values expressed in multiple bits. Nevertheless, since the SRAM 13 can only distinguish two states of "0" and "1", it is necessary to carry out image capturing under multiple conditions in order to acquire multiple tone levels.

To be more precise, the exposure time T is changed for 63 times such as $T_1 < T_2 < T_3 \ldots < T_{63}$, and then the point of reversal of the data (the binary values) in the exposure time is detected. In this way, it is possible to acquire 64 tone levels (in a six-bit value).

Specifically, reversal exposure time Tw in terms of a white standard subject and reversal exposure time Th in terms of a black standard subject are measured, and n-th exposure time T(n) (n=1, 2, . . . , 63) is found by the following equation:

$$\frac{1}{T(n)} = \frac{1}{Tw} - n\Delta \quad (4)$$

provided that, $$\Delta = \left(\frac{1}{Tw} - \frac{1}{Tb}\right) / 63 \quad (5)$$

By applying the equation (4) to the equation (3), a boundary value L(n) of the irradiation intensity set in an n-th image capturing attempt is found by the following equation:

$$L(n) = \frac{C(V - Vth)}{R}\left(\frac{1}{Tw} - n\Delta\right) - \frac{I_0}{R} \quad (6)$$

Figure 4:
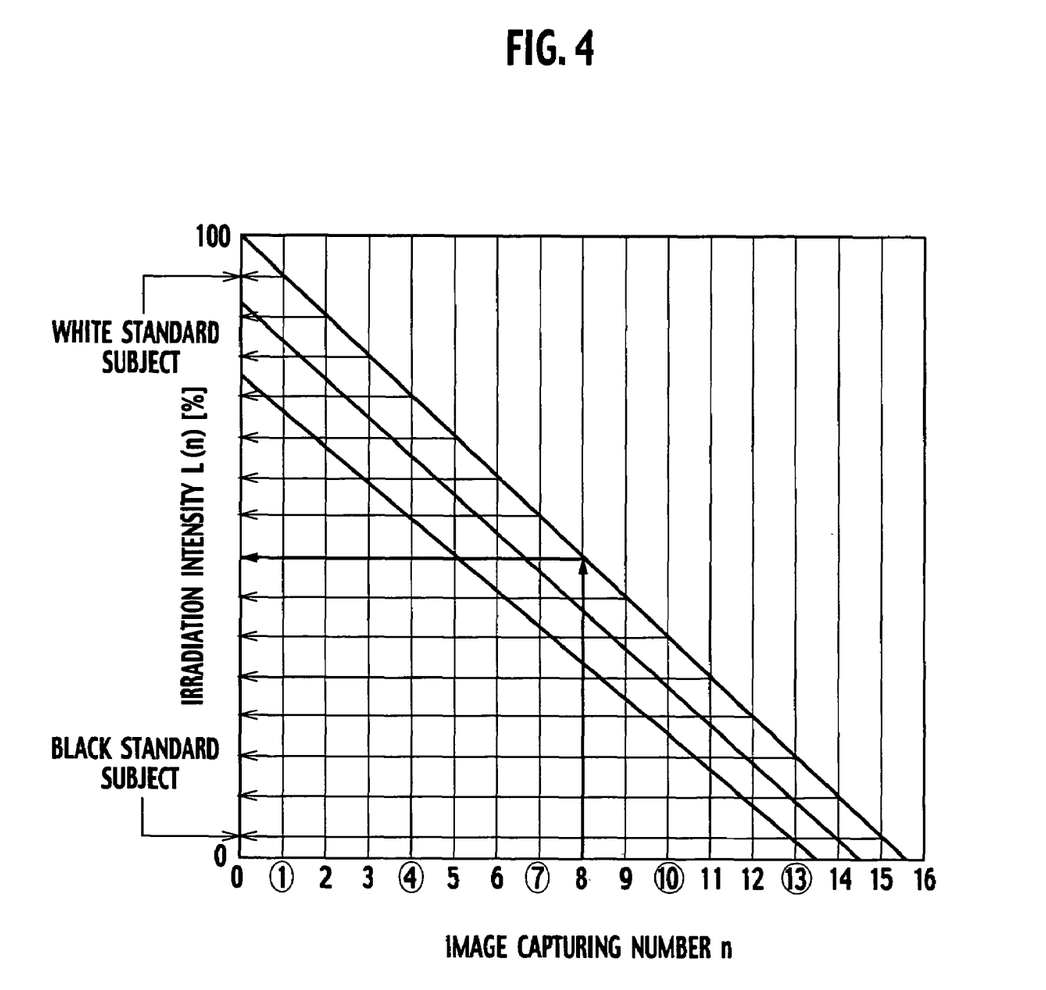
FIG. 4 is a graph showing a relation between an image capturing number n and a boundary value L(n) of irradiation intensity.

FIG. 4 shows a relation between an image capturing number n and the boundary value L(n) of the irradiation intensity. Here, in order to facilitate the explanation, FIG. 4 shows a case where image capturing is carried out for 15 times. For example, at a seventh image capturing, the boundary value L(n) of the irradiation intensity is reduced to approximately 50%.

When the respective parameter values of $(R_1, V_1, C_1, Vth_1)$ are used as standards among the respective parameters of $(R_1, V_1, C_1, Vth_1)$, $(R_2, V_2, C_2, Vth_2)$, and $(R_3, V_3, C_3, Vth_3)$ set in the liquid crystal display device 1, and when one of the parameters is varied depending on the pixels, relations of the respective parameter values can be expressed by the respective following equations. Here, k used in the equation below is a parameter for determining the size of variation amounts when the respective parameters are varied depending on the pixels. To be more precise, k is a value selected appropriately so as to distribute the boundary value of the irradiation intensity uniformly in a range defined as $1 \leq k \leq N-p \times q+1$, and k is not necessarily an integer in this regard.

In the case of varying the value R depending on the respective pixels:

$$R_2 = R_1 + \delta R \quad (7)$$

$$R_3 = R_1 + 2\delta R \quad (8)$$

$$\frac{\delta R}{R_1} = \Delta \cdot T(k) \cdot \frac{1}{1 - \frac{I_0 T(k)}{C_1(V_1 - Vth_1)}} \quad (9)$$

When m+1 (m=1, 2, and so on) pixels are formed into one set, the value of the sensitivity R of each pixel is expressed by the following equation:

$$R_{m+1} = R_1 + m\delta R \quad (10)$$

In the case of varying the value V depending on the respective pixels:

$$V_2 = V_1 - \delta V \quad (11)$$

$$V_3 = V_1 - 2\delta V \quad (12)$$

$$\frac{\delta V}{V_1 - Vth_1} = \Delta \cdot T(k) \quad (13)$$

When m+1 (m=1, 2, and so on) pixels are formed into one set, the value of the initial voltage V of each pixel is expressed by the following equation:

$$V_{m+1} = V_1 - m\delta V \quad (14)$$

In the case of varying the value C depending on the respective pixels:

$$C_2 = C_1 - \delta C \quad (15)$$

$$C_3 = C_1 - 2\delta C \quad (16)$$

$$\frac{\delta C}{C_1} = \Delta \cdot T(k) \quad (17)$$

When m+1 (m=1, 2, and so on) pixels are formed into one set, the value of the coefficient of capacitance C of each pixel is expressed by the following equation:

$$C_{m+1} = C_1 - m\delta C \quad (18)$$

In the case of varying the value Vth depending on the respective pixels:

$$Vth_2 = Vth_1 + \delta Vth \quad (19)$$

$$Vth_3 = Vth_1 + 2\delta Vth \quad (20)$$

$$\frac{\delta Vth}{V_1 - Vth_1} = \Delta \cdot T(k) \quad (21)$$

When m+1 (m=1, 2, and so on) pixels are formed into one set, the value of the threshold voltage Vth of each pixel is expressed by the following equation:

$$Vth_{m+1} = Vth_1 + m\delta Vth \quad (22)$$

Regarding the pixel having the parameters of $(R_1, V_1, C_1, Vth_1)$ as the standards, assuming that the reversal exposure time in terms of the white standard subject is Tw and that the reversal exposure time in terms of the black standard subject is Th, n-th exposure time T(n) (n=1, 2, ..., N (in the case of image capturing for N times)) can be expressed by the following equation:

$$\frac{1}{T(n)} = \frac{1}{Tw} - n\Delta \qquad (23)$$

wherein $$\Delta = \left(\frac{1}{Tw} - \frac{1}{Tb}\right)/N \qquad (24)$$

Figure 5:
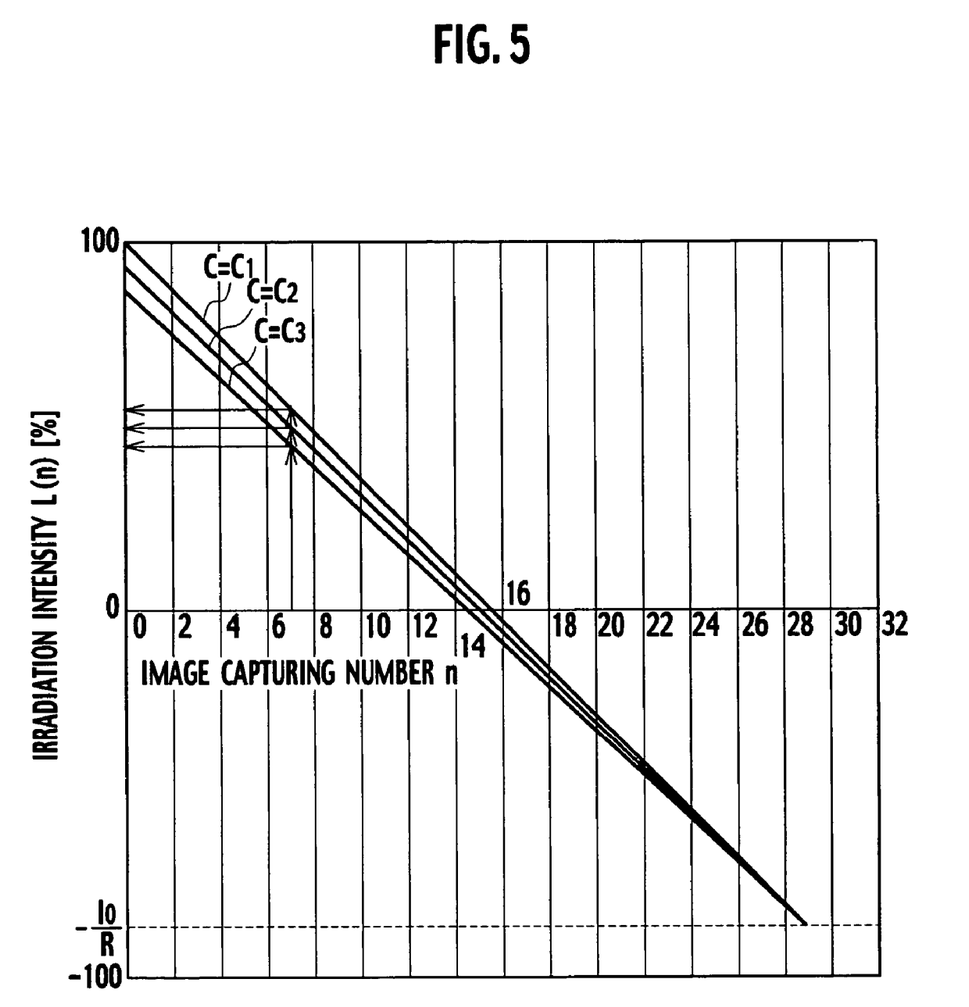
FIG. 5 is a graph showing a relation between the image capturing number n and the boundary value L(n) of the irradiation intensity when changing a value of C depending on the respective pixels.

As an example, a relation between the image capturing number n and the boundary value L(n) of the irradiation intensity in the case of varying only the coefficient of capacitance C of the capacitor 12 depending on the pixels such as values of $C_1$, $C_2$, and $C_3$ is shown in FIG. 5. Here, the image capturing number n on the lateral axis means the number of image capturing using the standard pixel.

When $C_1$, $C_2$, and $C_3$ are mutually different values, the relation between the image capturing number n and the boundary value L(n) of the irradiation intensity varies as shown in FIG. 5. Accordingly, it is possible to set three points of boundary values of the irradiation intensity in one image capturing. In this way, while it has been necessary to carry out image capturing for 15 times and thereby to set up 15 relevant points of the boundary values of the irradiation intensity in order to acquire, for example, a 16-tone-level image with the conventional liquid crystal display device, the liquid crystal display device of the present invention can reduce the number of image capturing to one-third, or namely to 5 times.

Figure 6:
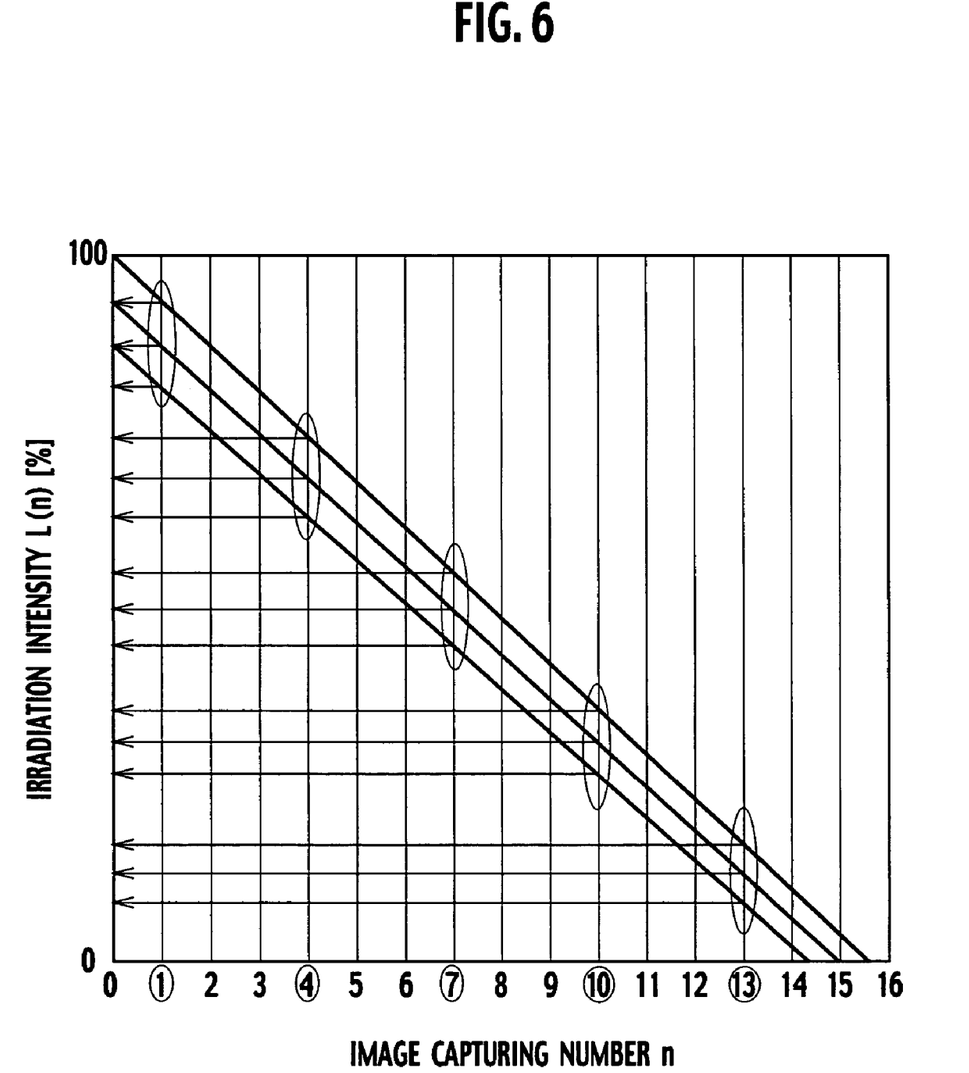
FIG. 6 is a graph showing a relation between the image capturing number n and the boundary value L(n) of the irradiation intensity when setting k=1.
Figure 7:
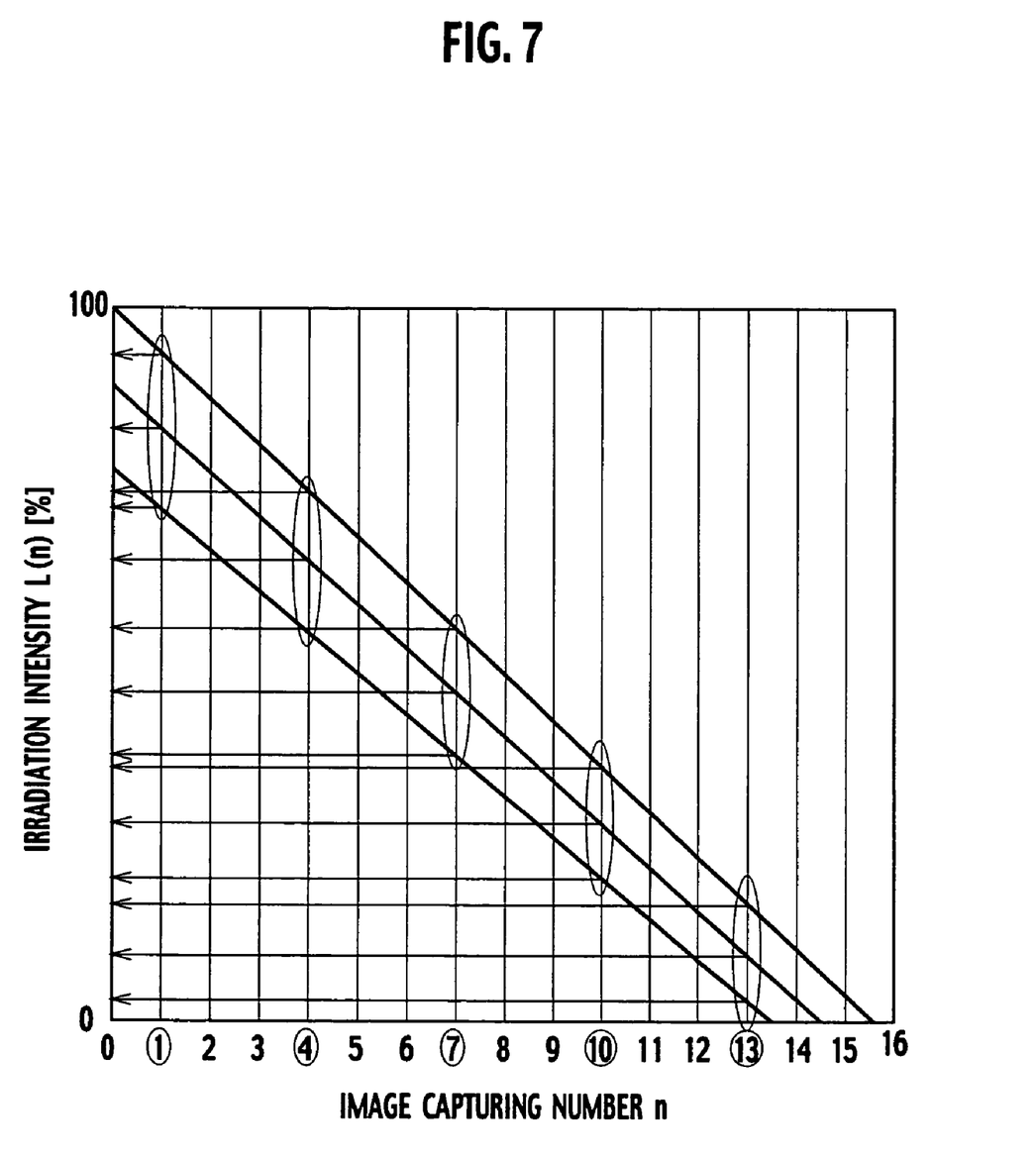
FIG. 7 is a graph showing a relation between the image capturing number n and the boundary value L(n) of the irradiation intensity when setting k=13.

As described above, when $C_1$, $C_2$, and $C_3$ are mutually different values, it is possible to set up three points of the boundary values of the irradiation intensity in each time of image capturing. The distribution of the respective boundary values vary depending on the value k. For example, when k=1 is set, 15 points are set up by 5 times of image capturing as shown in FIG. 6. Meanwhile, when k=13 is set, 15 points are set up by 5 times of image capturing as shown in FIG. 7. As the value k, it is preferable to select the most appropriate value to achieve uniform distribution of the boundary values. Although the values of $C_1$, $C_2$, and $C_3$ have been herein varied as an example, similar rules will apply to a case of other parameters.

Moreover, in the case of varying two or more parameters out of R, V, C, and Vth depending on the pixels, it is again preferable to select the most appropriate value k depending on the pixels to achieve uniform distribution of the boundary values.

Specifically, variation of the values of the respective parameters depending on the pixels will be achieved as follows. In terms of the sensitivity R, variation will be achieved by changing the area or the thickness of a sensor element for each pixel or by changing impurity density for each pixel. In terms of the initial voltage V, variation will be achieved by applying a different voltage to each pixel through the signal line used for charging the capacitor 12 of each pixel. In terms of the capacitance C, variation will be achieved by changing the area of a parallel-flat plate capacitor for each pixel. In terms of the threshold voltage Vth, variation will be achieved by changing a gate length of an N-channel type TFT and a gate length of a P-channel type TFT constituting the inverter, for each pixel.

When pieces of binary data $D_1$, $D_2$, $D_3$, and so on are respectively inputted from the pixels having the values of the respective parameters as defined in the above-described equations, the image capturing control unit 5 generates and outputs pieces of pixel data $G_1$, $G_2$, $G_3$, and so on in multiple tone levels as the data outputted from one pixel, based on the binary data of a predetermined number of mutually adjacent pixels. For example, data in three tone levels are acquired when generating the pixel data for one pixel based on the binary data from three pixels. Accordingly, the image capturing control unit 5 generates and outputs a piece of pixel data $G_1$ having a data length of 2 bits by use of the pieces of pixel data $D_1$, $D_2$, and $D_3$.

When the pieces of pixel data $G_1$, $G_2$, $G_3$, and so on in multiple tone levels are sequentially inputted from the image capturing control unit 5, the controller 2 generates and outputs one piece of image data in multiple tone levels. When an image is captured by use of three pixels in one set, the piece of image data generated in one image capturing constitutes a piece of data in three tone levels. Here, it is possible to acquire color image data by performing image capturing in respective colors of RGB.

Therefore, according to this embodiment, it is possible to increase tone level information of the image data acquired in one image capturing by generating the pixel data in multiple tone levels with the image capturing control unit 5 based on the binary data acquired from the plurality of adjacent pixels having mutually different values of the respective parameters.

Specifically, when the number of the adjacent pixels is defined as p×q pieces, it is possible to acquire the image data in the same tone levels in a period of 1/(p×q) times in comparison with the time required by the conventional liquid crystal display device. In this way, it is possible to reduce the time for image shooting. Moreover, the number of image capturing can be reduced from N times to N/(p×q) times. As the time for image shooting is reduced, it is possible to reduce image degradation attributable to hand movement or the like.

Note that, although the three pixels aligned in the lateral direction have been treated as one set in this embodiment, such arrangement will not actually reduce the resolution to one-third. That is, in a typical liquid crystal display device, each pixel has a vertically long form and the length of three pixels in the lateral direction is approximately equal to the length of one pixel in the longitudinal direction. Moreover, when an image-forming system (a lens) is not applied, the original resolution is far worse than the length of one pixel in the lateral direction owing to diffusion of the light from the subject. Due to these reasons and the like, the resolution will not be actually reduced.

Meanwhile, the method of setting the values of the respective parameters to different values depending on the pixels is also effective when carrying out color image shooting. Color image shooting is achieved by performing image shooting in terms of a plurality of colors while switching a display color of the liquid crystal display device. Here, the optical sensitivity largely varies depending on the colors and therefore it is not possible to apply the same image shooting condition for the respective colors. However, it is possible to achieve image shooting under the same condition by applying the foregoing method. For example, when the optical sensitivity is low for the red color, the sensitivity of the sensor of the pixel corresponding to the red color should be set to a higher value than the sensitivity of the sensors of the pixels corresponding to other colors.

What is claimed is:

1. A liquid crystal display device comprising:
   a plurality of pixels;
   a plurality of optical sensors corresponding to each of the plurality of pixels, each optical sensor having a sensitivity R and each optical sensor being configured to convert an accepted light into an electric signal;

a plurality of charge storage units corresponding to each of the plurality of optical sensors, each charge storage unit having a capacitance C and each charge storage unit being configured to store a charge in response to the electric signal converted by the optical sensor while the optical sensor has an initial voltage V applied;

a plurality of retention units corresponding to each of the plurality of charge storage units, each retention unit being configured to retain a plurality of binary data, said binary data indicating whether an amount of charge stored in the charge storage unit is equal to or above a threshold voltage Vth;

an image capturing control unit configured to generate a plurality of pixel data in a plurality of tone levels, based on the binary data outputted from each of the retention units of the plurality of adjacent pixels by image capturing for N times, wherein at least one value of sensitivity R, capacitance C, initial voltage V, and threshold voltage Vth in each of the pixels is set to a different value from a relevant value of other adjacent pixels; and wherein, in terms of p×q adjacent pixels of the plurality of adjacent pixels, an exposure time T(n) for an n-th (n=1, 2, ..., N) image capturing by a specified pixel is calculated based on an average dark current $I_0$, a reversal exposure time Tw in terms of a white standard subject for the specified pixel, a reversal exposure time Tb in terms of a black standard subject for the specified pixel, and with equations expressed as $$\frac{1}{T(n)} = \frac{1}{Tw} - n\Delta, \Delta = \left(\frac{1}{Tw} - \frac{1}{Tb}\right)/N,$$

and a parameter k, to determine an amount of variation of sensitivity for each of the plurality of pixels, is set in a range defined as $1 \leq k \leq N-p\times q+1$ and, based on a standard value of sensitivity $R_1$ set in the specified pixel, a plurality of respective values of sensitivity $R_2$ to $R_{p\times q}$ set in other pixels are calculated by equations expressed as $$R_{m+1} = R_1 + m\delta R, \frac{\delta R}{R_1} = \Delta \cdot T(k) \cdot \frac{1}{1 - \frac{I_0 T(k)}{C_1(V_1 - Vth_1)}}$$

(where m=1, 2, ..., p×q−1).

2. The liquid crystal display device according to claim 1, wherein, in terms of p×q adjacent pixels of the plurality of adjacent pixels, exposure time T(n) for an n-th (n=1, 2, ..., N) image capturing by a specified pixel is calculated based on an average dark current $I_0$, a reversal exposure time Tw in terms of a white standard subject for the specified pixel, a reversal exposure time Tb in terms of a black standard subject for the specified pixel, and with equations expressed as $$\frac{1}{T(n)} = \frac{1}{Tw} - n\Delta, \Delta = \left(\frac{1}{Tw} - \frac{1}{Tb}\right)/N,$$

and a parameter k, to determine an amount of variation of sensitivity for each of the plurality of pixels, is set in a range defined as $1 \leq k \leq N-p\times q+1$, and, based on a standard value of capacitance $C_1$ set in the specified pixel, a plurality of respective values of capacitance $C_2$ to $C_{p\times q}$ set in other pixels are calculated by equations expressed as $$C_{m+1} = C_1 - m\delta C, \frac{\delta C}{C_1} = \Delta \cdot T(k)$$

(where m=1, 2, ..., p×q−1).

3. The liquid crystal display device according to claim 1, wherein, in terms of p×q adjacent pixels of the plurality of adjacent pixels, exposure time T(n) for an n-th (n=1, 2, ..., N) image capturing by a specified pixel is calculated based on an average dark current $I_0$, a reversal exposure time Tw in terms of a white standard subject for the specified pixel, a reversal exposure time Tb in terms of a black standard subject for the specified pixel, and with equations expressed as $$\frac{1}{T(n)} = \frac{1}{Tw} - n\Delta, \Delta = \left(\frac{1}{Tw} - \frac{1}{Tb}\right)/N,$$

and a parameter k, to determine an amount of variation of sensitivity for each of the plurality of pixels, is set in a range defined as $1 \leq k \leq N-p\times q+1$, and, based on a standard value of initial voltage $V_1$ set in the specified pixel, a plurality of respective values of initial voltage $V_2$ to $V_{p\times q}$ set in other pixels are calculated by equations expressed as $$V_{m+1} = V_1 - m\delta V, \frac{\delta V}{V_1 - Vth_1} = \Delta \cdot T(k)$$

(where m=1, 2, ..., p×q−1).

4. The liquid crystal display device according to claim 1, wherein, in terms of p×q adjacent pixels of the plurality of adjacent pixels, exposure time T(n) for an n-th (n=1, 2, ..., N) image capturing by a specified pixel is calculated based on an average dark current $I_0$, a reversal exposure time Tw in terms of a white standard subject for the specified pixel, a reversal exposure time Tb in terms of a black standard subject for the specified pixel, and with equations expressed as $$\frac{1}{T(n)} = \frac{1}{Tw} - n\Delta, \Delta = \left(\frac{1}{Tw} - \frac{1}{Tb}\right)/N,$$

and a parameter k, to determine an amount of variation of sensitivity for each of the plurality of pixels, is set in a range defined as $1 \leq k \leq N-p\times q+1$, and, based on a standard value of threshold voltage $Vth_1$ set to the specified pixel, a plurality of respective values of threshold voltage $Vth_2$ to $Vth_{p\times q}$ set in other pixels are calculated by equations expressed as $$Vth_{m+1} = Vth_1 + m\delta Vth, \frac{\delta Vth}{V_1 - Vth_1} = \Delta \cdot T(k)$$

(where m=1, 2, ..., p×q−1).

* * * * *